United States Patent
Jung

(10) Patent No.: US 7,964,914 B2
(45) Date of Patent: Jun. 21, 2011

(54) SEMICONDUCTOR DEVICE AND METHOD FOR FABRICATING THE SAME INCLUDING A GATE INSULATION LAYER AND CONDUCTIVE LAYER SURROUNDING A PILLAR PATTERN

(75) Inventor: Jin-Ki Jung, Kyoungki-do (KR)

(73) Assignee: Hynix Semiconductor Inc., Ichon-shi, Kyounki-do (KR)

( * ) Notice: Subject to any disclaimer, the term of this patent is extended or adjusted under 35 U.S.C. 154(b) by 58 days.

(21) Appl. No.: 12/164,504

(22) Filed: Jun. 30, 2008

(65) Prior Publication Data
US 2009/0159965 A1    Jun. 25, 2009

(30) Foreign Application Priority Data
Dec. 21, 2007   (KR) .................. 10-2007-0135091

(51) Int. Cl.
H01L 29/76 (2006.01)
H01L 29/94 (2006.01)
H01L 31/062 (2006.01)
H01L 31/113 (2006.01)
H01L 31/119 (2006.01)
H01L 21/336 (2006.01)
H01L 21/20 (2006.01)

(52) U.S. Cl. .................. 257/331; 438/270; 438/390

(58) Field of Classification Search .......... 438/270, 438/390; 257/331, E29.262, E21.41
See application file for complete search history.

(56) References Cited

U.S. PATENT DOCUMENTS

| | | | |
|---|---|---|---|
| 5,155,059 A * | 10/1992 | Hieda | 438/155 |
| 6,049,106 A | 4/2000 | Forbes | |
| 6,114,725 A * | 9/2000 | Furukawa et al. | 257/330 |
| 6,137,128 A | 10/2000 | Holmes et al. | |
| 6,316,309 B1 * | 11/2001 | Holmes et al. | 438/246 |
| 2005/0208769 A1 * | 9/2005 | Sharma | 438/700 |
| 2005/0218521 A1 * | 10/2005 | Lee | 257/758 |
| 2006/0240361 A1 | 10/2006 | Lee et al. | |
| 2007/0111422 A1 * | 5/2007 | Lutze et al. | 438/201 |
| 2008/0308856 A1 * | 12/2008 | Specht et al. | 257/316 |

FOREIGN PATENT DOCUMENTS

| | | |
|---|---|---|
| KR | 100660881 | 12/2006 |
| KR | 100675285 | 1/2007 |
| KR | 10-0723527 | 5/2007 |

OTHER PUBLICATIONS

Korean Notice of Allowance for Korean Patent Application No. 10-2007-0135091.
Office Action dated Jun. 29, 2009, for Korean application No. 10-2007-0135091.
Chinese Office Action for 200810211691.4, citing the above reference(s).

* cited by examiner

*Primary Examiner* — William M. Brewster
(74) *Attorney, Agent, or Firm* — Lowe Hauptman Ham & Berner LLP

(57) ABSTRACT

A semiconductor device includes pillar patterns, a gate insulation layer surrounding the pillar patterns, and a conductive layer surrounding the gate insulation layer and connects neighboring gate insulation layers.

32 Claims, 19 Drawing Sheets

II-II'

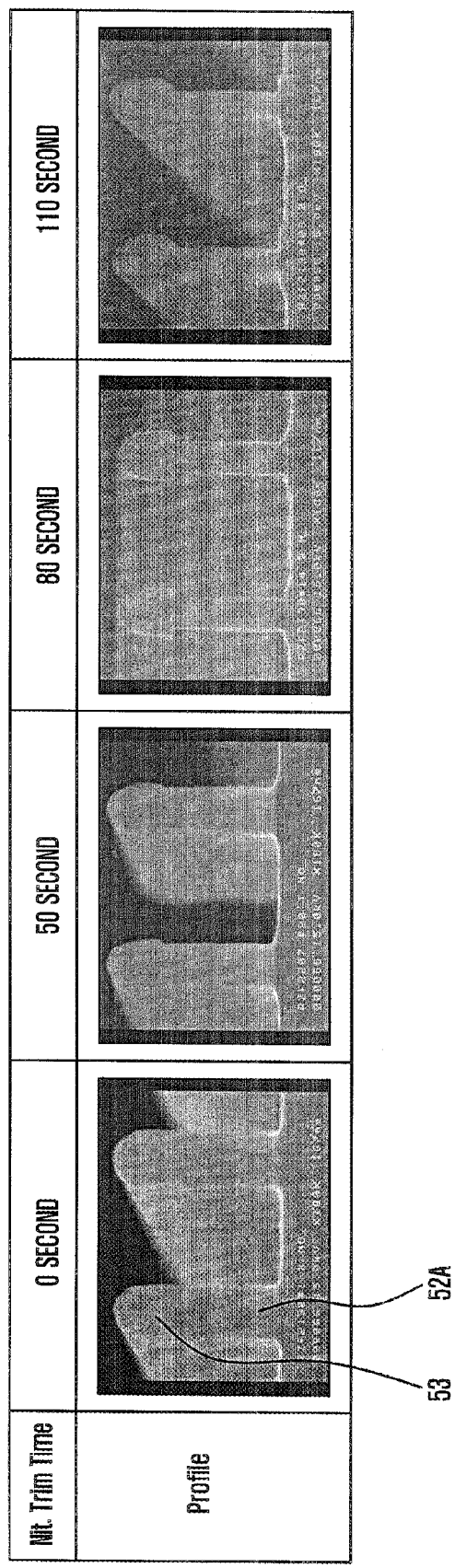

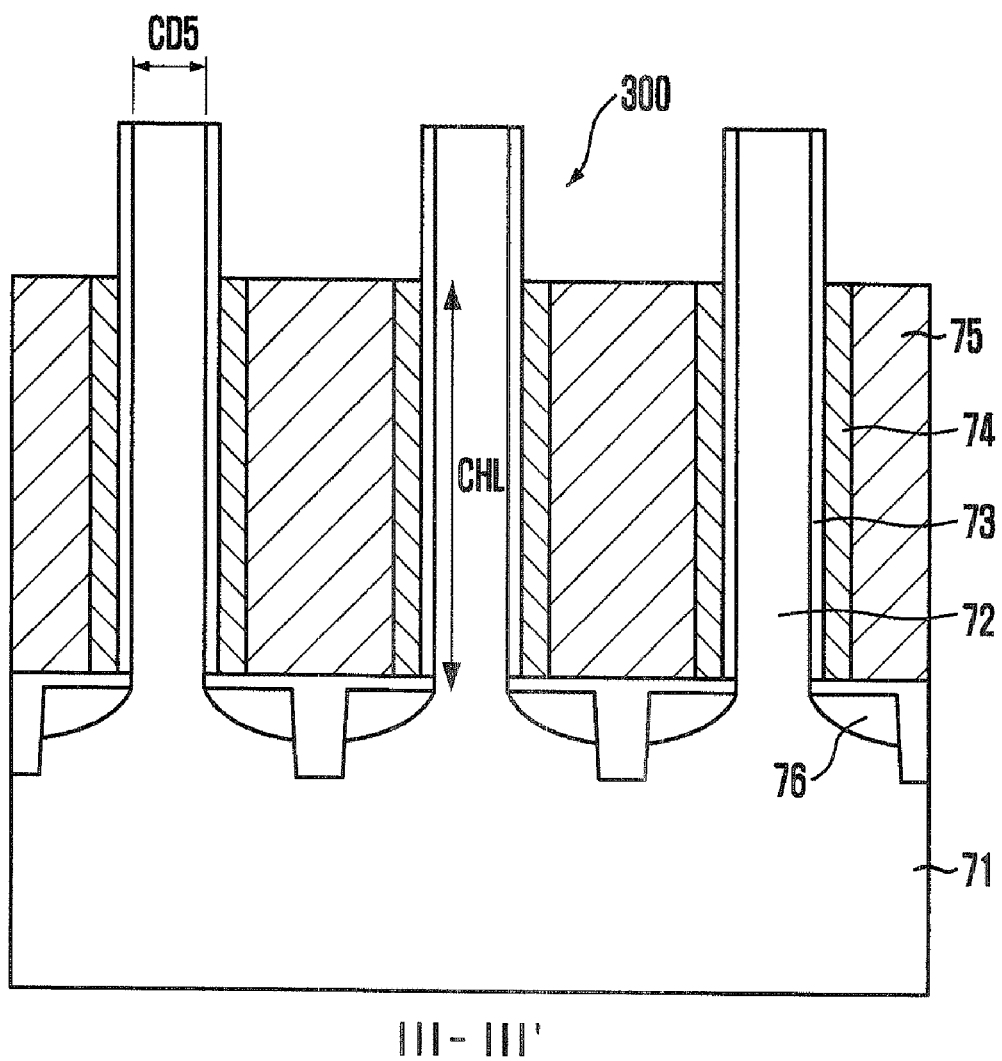

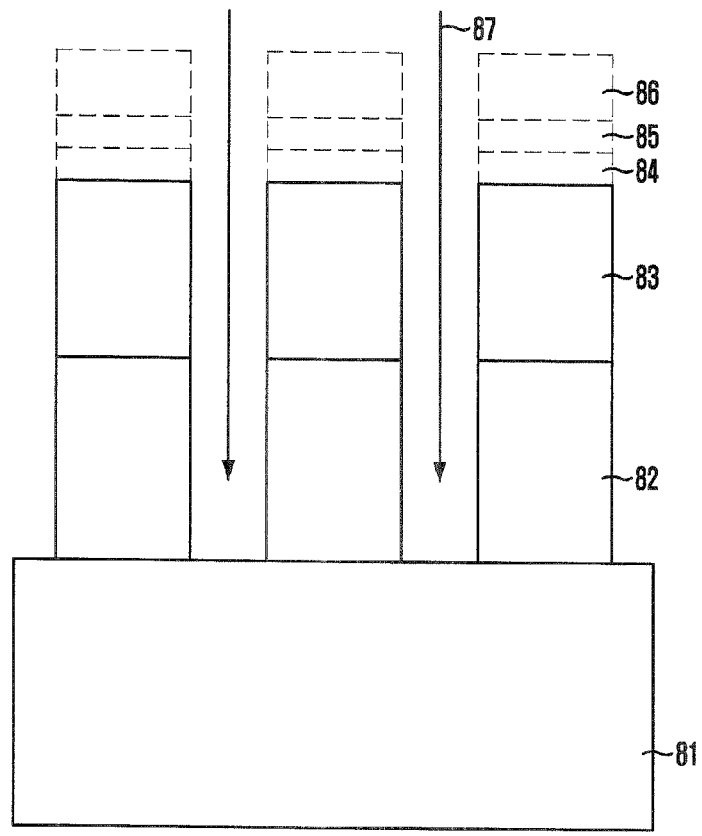
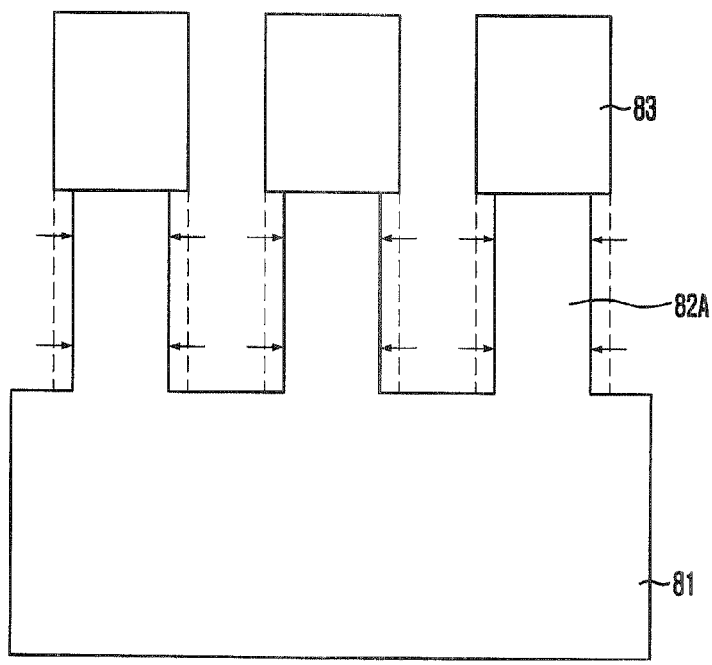

SEMICONDUCTOR DEVICE AND METHOD FOR FABRICATING THE SAME INCLUDING A GATE INSULATION LAYER AND CONDUCTIVE LAYER SURROUNDING A PILLAR PATTERN

CROSS-REFERENCE TO RELATED APPLICATIONS

The present invention claims priority of Korean patent application number 2007-0135091, filed on Dec. 21, 2007, which is incorporated by reference in its entirety.

BACKGROUND OF THE INVENTION

The present invention relates to a method for fabricating a semiconductor device, and more particularly, to a semiconductor device having an upper/lower channel.

Recently, reduction in semiconductor device design rule has led to a decrease in dimension of a unit memory cell.

In order to cope with the decrease in the dimension of a unit memory cell, a transistor having an upper/lower channel formed by vertically arranging the source and drain in an active region is introduced.

FIG. 1A is a cross-sectional view of a typical upper/lower transistor array and FIG. 1B is a top view of the typical upper/lower transistor array. In FIG. 1B, a line pattern and a gate pattern in FIG. 1A are enlarged.

Referring to FIGS. 1A and 1B, the upper/lower transistor array includes a plurality of transistors with an upper/lower channel. Each transistor includes a pillar pattern 11 and a gate pattern 12 formed on sidewalls of the pillar pattern 11. The gate pattern 12 includes a gate insulation layer 12B and a gate electrode 12A. Also, the transistor includes a source and a drain formed in upper and lower portions of the pillar pattern 11. The source 14A and drain 14B formed in the lower portion of the pillar pattern 11 functions as a line, which connects the gate pattern 12 and a line pattern 13.

The line pattern 13 has a first linewidth CD1. The first linewidth CD1 is fixed by the design rule. Likewise, a linewidth of the pillar pattern 11 defining a width of the transistor is fixed due to a limitation in the photo-exposure technology. That is, when a develop inspection critical dimension (DICD) of a photoresist pattern is 50 nm or less, the photoresist pattern collapses.

FIG. 2 is an electron microscopic picture of a collapsed photoresist pattern.

Referring to FIG. 2, when a develop inspection critical dimension (DICD) of a photoresist pattern is 50 nm or less, the photoresist pattern collapses. Thus, the width of the photoresist pattern 21 is limited. Therefore, the width of the pillar pattern 11 and the width of the gate pattern 12 are substantially the same since the width of the pillar pattern 11 is limited by the width of the gate pattern 12.

Referring to FIG. 1B, the line pattern 13 is not formed in a line due to the above process condition. A gate electrode 12A of the gate pattern 12 is formed between the line patterns 13 and the gate electrode 12A functions as a wordline. Generally, when the conductive material is formed in a line, it can have minimum resistance. For instance, a planar type wordline is formed to have one conductive pattern. Thus, it is possible to secure the minimal resistance.

However, in the upper/lower channel transistor, the line pattern 13 and gate electrode 12A are not formed in one conductive material. Thus, the resistance increases. Driving voltage of the transistor is applied to the wordline.

FIG. 3 is a top view of the wordline.

Referring to FIG. 3, the wordline 31 has a third linewidth CD3. The third linewidth CD3 is the width of the gate electrode 12A.

Since resistance of a line is inverse proportional to its surface area, the wordline 31 with a third linewidth CD3 will decrease the transmission efficiency of the driving voltage when it is applied to a transistor.

The wordline 31 has a stack structure having a metal layer and a polysilicon layer having higher resistance than the metal layer, which further increases the resistance of the wordline 31. Further, the contact resistance is increased due to the insufficiency in the contact area between the line pattern 13 and the gate electrode 12A. The increase in the contact resistance has contributed to the overall increase in the resistance in the wordline 31.

As a result, the transmission efficiency of the driving voltage of each transistor in the transistor array decreases, thereby decreasing reliability and stability of the device.

SUMMARY OF THE INVENTION

Embodiments of the present invention are directed to provide a method for fabricating a semiconductor device, and more particularly, to a semiconductor device with an upper/lower channel.

In this invention, the transmission efficiency of the driving voltage for transistors in a transistor array is increased and a collapse of pillar patterns is prevented.

In accordance with an aspect of the present invention, there is provided a semiconductor device including pillar patterns, a gate insulation layer surrounding the pillar pattern, and a conductive layer surrounding the gate insulation layer while connecting neighboring gate insulation layers.

In accordance with another aspect of the present invention, there is provided a semiconductor device including a plurality of pillar patterns, a gate insulation layer surrounds the pillar pattern, a gate electrode surrounds the gate insulation layer, and a line layer surrounds the gate electrode and connects neighboring gate electrodes.

In accordance with still another aspect of the present invention, there is provided a semiconductor device including pillar patterns, a gate insulation layer surrounding the pillar patterns, and a conductive layer surrounding the gate insulation layer and connects neighboring gate insulation layers.

In accordance with a further aspect of the present invention, there is provided a semiconductor device including pillar patterns, a gate insulation layer surrounding the pillar patterns, a gate electrode surrounding the gate insulation layer; and a line layer surrounding the gate electrode and connects neighboring gate electrodes.

BRIEF DESCRIPTION OF THE DRAWINGS

FIG. 6 shows electron microscopic pictures of the gate hard mask layer having a decreasing width as time passes.

FIG. 9A is a cross-sectional view of a semiconductor device in accordance with a second embodiment of the present invention.

FIGS. 10A to 10H are cross-sectional views describing a method for fabricating the semiconductor device having an upper/lower transistor in accordance with the second embodiment of the present invention.

DESCRIPTION OF SPECIFIC EMBODIMENTS

Embodiments of the present invention relate to a method for fabricating a semiconductor device, and more particularly, to a method for fabricating the same.

In a semiconductor having a planar transistor, a wordline indicates that a conductive layer is simultaneously functioning as a line and a gate of the transistor. In embodiments of the present invention, the gate electrode and the line in the transistor are called a wordline.

Figure 4A:
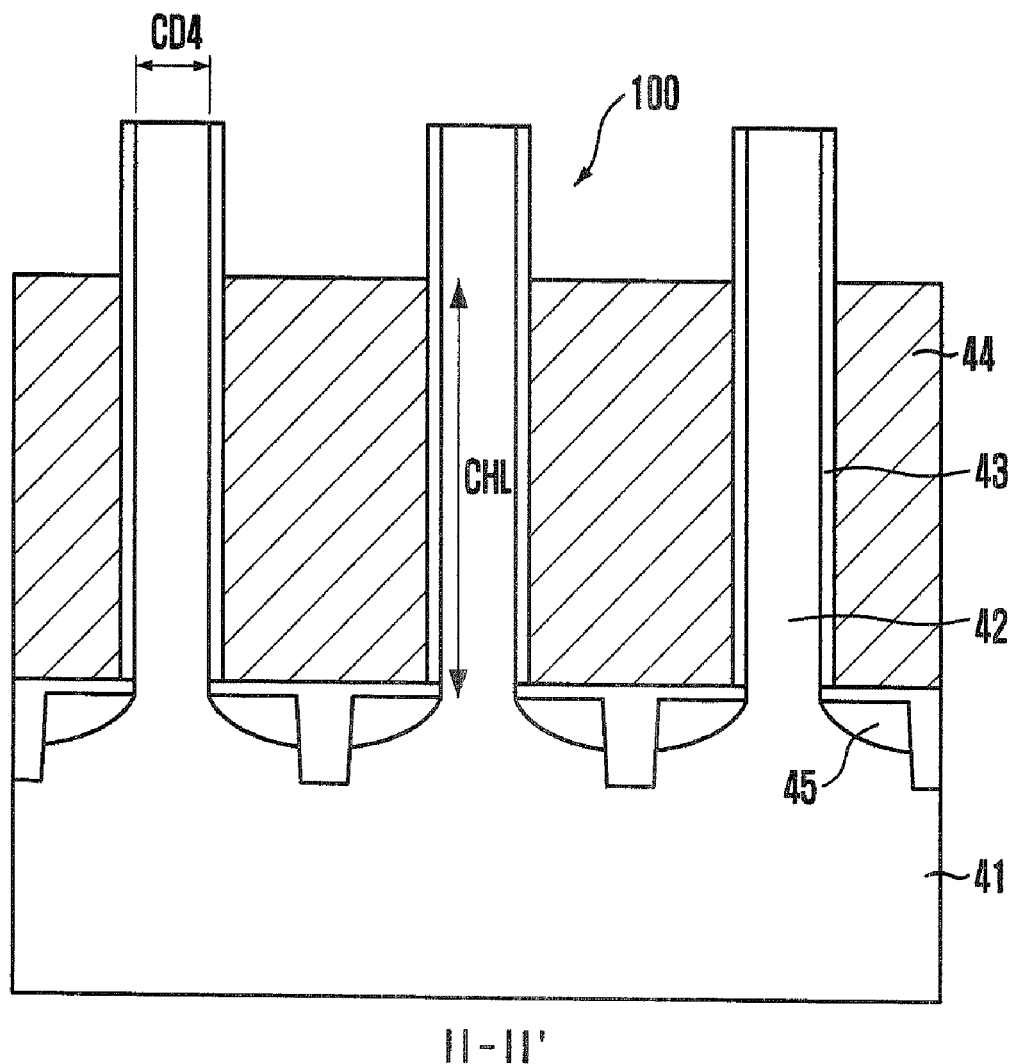
FIG. 4A is a cross-sectional view of a semiconductor device in accordance with a first embodiment of the present invention.

FIG. 4A is a cross-sectional view of a semiconductor device in accordance with a first embodiment of the present invention.

Figure 4B:
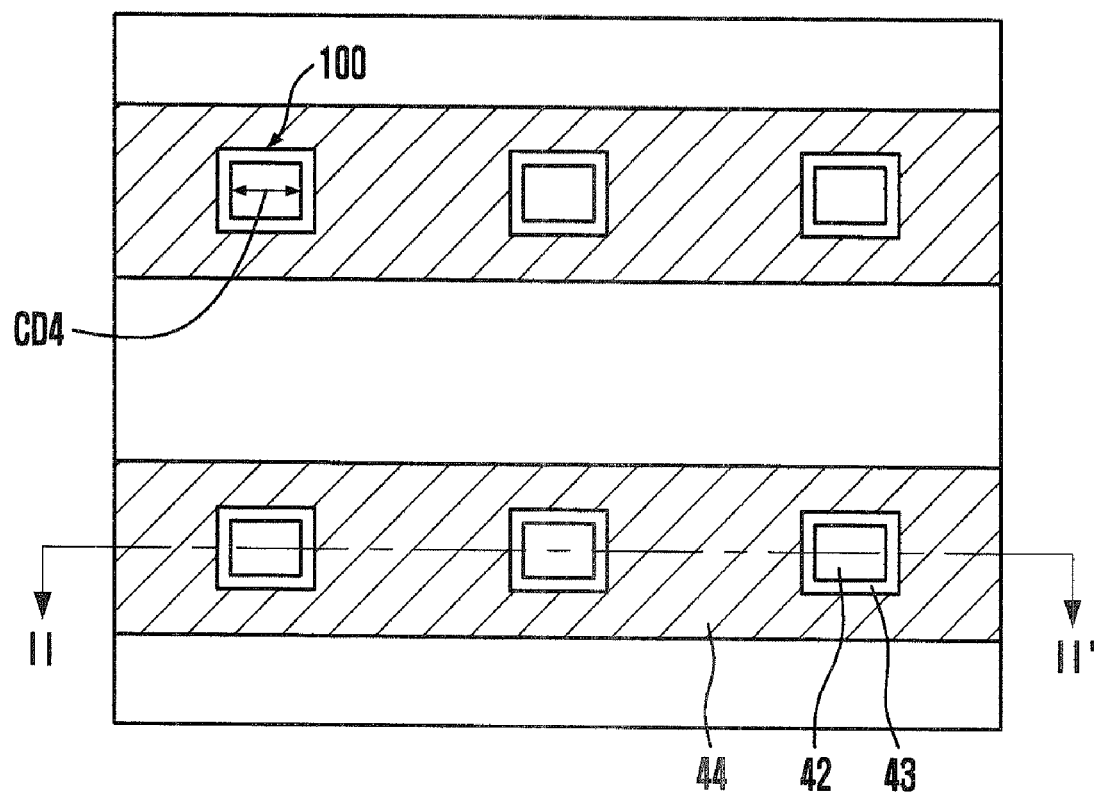
FIG. 4B is a top view of the semiconductor device in accordance with the first embodiment of the present invention.

FIG. 4B is the top view of the semiconductor device in accordance with the first embodiment of the present invention.

Referring to FIGS. 4A and 4B, the semiconductor device comprises a plurality of transistors 100 having upper and lower channels, a conductive layer 44 functioning as a wordline, and a buried bit line 45 functioning as a bit line. The upper/lower channel transistor comprises a vertical transistor. The transistor 100 comprises: a pillar pattern 42, a gate insulation layer 43 formed on sidewalls of the pillar pattern 42, and a conductive layer 44 formed on sidewalls of the gate insulation layer 43 and functioning as a gate electrode and a word line. The transistor 100 further comprises source and drain formed over the substrate 41 adjacents to the pillar pattern 42 contacting upper and lower portions of the pillar pattern 42 to form the upper and lower channels. The source and the drain may also be formed at the upper and lower portions of the pillar pattern 42.

The buried bitline is a line for transmitting data; wherein the data are either holes or electrons that can be transmitted to/from the transistor 100 to the external. For the transmission, the buried bitline 45 may be a conductive pattern contacting the source and the drain in the transistor 100 or an impurity region doped in the substrate 41. In this embodiment, the source and the drain are used to skip the formation of separate conductive pattern and impurity region. That is, the source and the drain formed in the substrate 41 function as the buried bitline 45.

The pillar pattern 42 is formed by etching substrate 41 or performing deposition and patterning processes. The pillar pattern 42 is made of silicon (Si) and is formed in a square-type or a round-type. Sidewalls of the pillar pattern 42 have a vertical profile.

The pillar pattern 42 has a fourth width CD4 of 50 nm or less. For instance, the width of the fourth linewidth CD4 may range from approximately 5 nm to approximately 50 nm. This is because the pillar pattern 42 is formed by a trimming process. The trimming process will be described in detail later.

The conductive layer 44 functions as a gate electrode to form an upper/lower channel CHL. The conductive layer 44 also functions as a line for transmitting driving voltages to a plurality of transistors. The conductive layer 44 may be a uniform layer comprises of one material, which surrounds the pillar pattern 42. That is, the conductive layer 44 is formed in a line to transmit the driving voltage. This is made possible due to the decrease in the linewidth of the pillar pattern 42. A wordline which is not related with the contact resistance is formed, i.e., the wordline is formed as a uniform thin layer and functions as the gate electrode and the line.

The conductive layer 44 includes one selected from the group consisting of a polysilicon layer, a silicon germanium (SiG) layer, and a metal layer. When the conductive layer includes the metal layer, a wordline having low resistance is formed, thereby increasing transmission efficiency of the driving voltage.

The buried bit line 45 is formed by doping impurities.

A method for fabricating a semiconductor device with an upper/lower channel transistor will be described, hereinafter.

FIGS. 5A to 5F are cross-sectional views describing a method for fabricating a semiconductor device with the upper/lower channel transistor.

Figure 5A:
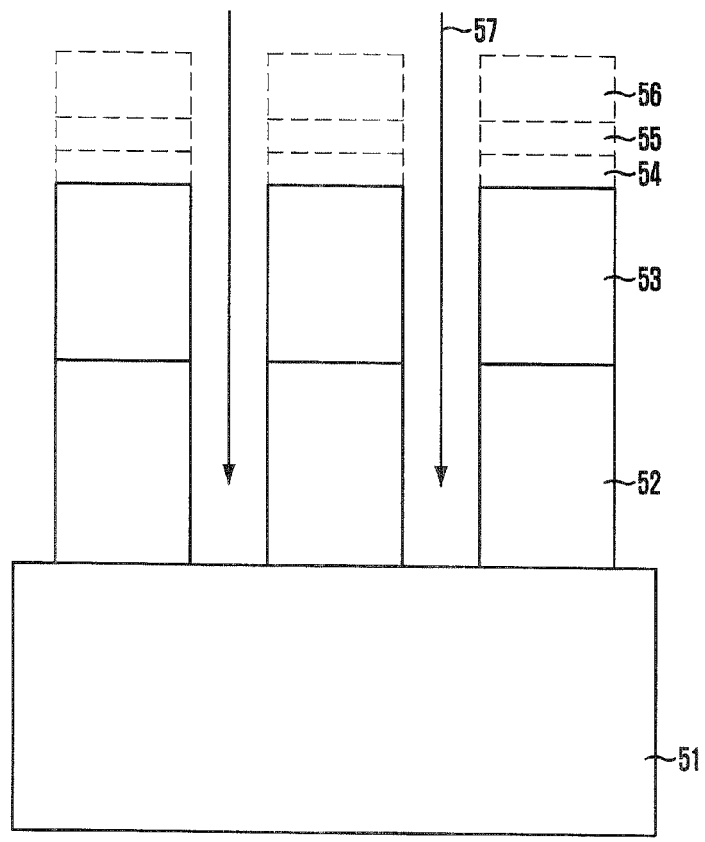
FIGS. 5A to 5F are cross-sectional views of a method for fabricating the semiconductor device having an upper/lower channel transistor.

Referring to FIG. 5A, the fabrication of the transistor begins with forming a gate hard mask layer 52 and a plurality of hard mask layers over a substrate 51.

The gate hard mask layer 52 may be a nitride layer, specifically a silicon nitride ($Si_3N_4$) layer.

The hard mask layers include a first hard mask layer 53 and a second hard mask layer 54. An anti-reflection coating (ARC) layer 55 and a photoresist pattern 56 are formed over the second hard mask layer 54.

The first hard mask layer 53 includes an amorphous carbon layer and the second hard mask layer 54 includes a silicon oxy-nitride (SiON) layer.

The ARC layer 55, the second hard mask layer 54, the first hard mask layer 53, and the gate hard mask layer 52 are etched using the photoresist pattern 56 as an etch barrier. The photoresist pattern 56 and the ARC layer 55 are removed when the first hard mask layer 53 is etched. The second hard mask layer 54 is also removed when the gate hard mask layer 52 is etched.

Figure 5B:
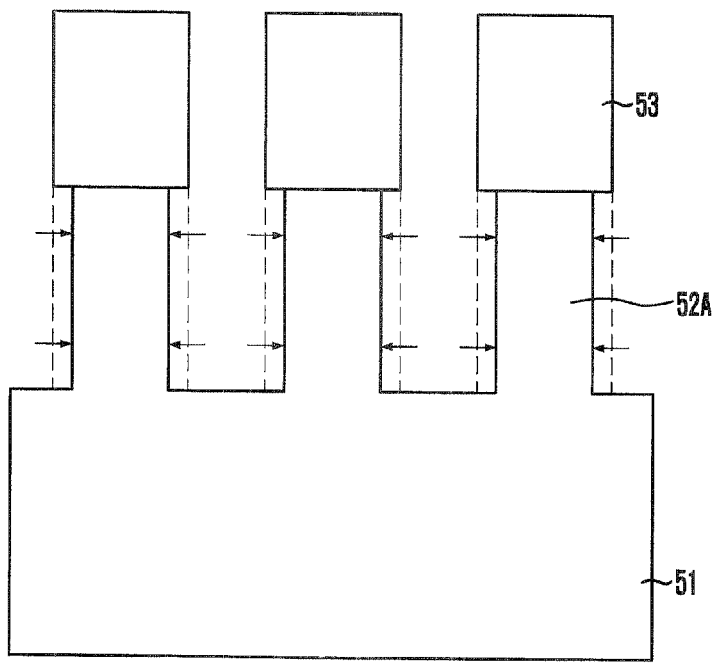

Referring to FIG. 5B, the trimming process is performed to decrease the width of the gate hard mask layer 52. The gate hard mask layer 52 having a decreased linewidth is called a gate hard mask pattern 52A. The trimming process is performed until the width of the gate hard mask layer 52 becomes approximately 50 nm or less, more specifically, from approximately 5 nm to approximately 50 nm.

The trimming process is performed to decrease the width of an etch target. The trimming process is performed by increasing at least any one feature selected from the group consisting of: flowing rate of an etch gas, a source power, a chamber pressure, a substrate temperature from the conditions applied to the process for forming the gate hard mask layer 52. For instance, the flow rate of an etch gas and the source power may increase or the flow rate of the etch gas, the source power, and the substrate temperature may increase. Or, the flow rate of the etch gas, the source power, the chamber pressure, and the substrate temperature may all increase. The source power is applied to generate etch plasma from the etch gas. The trimming process is also performed by decreasing a bias power while maintaining the other conditions applied to the process for fabricating the gate hard mask layer 52. The bias power is applied to induce the etch plasma toward the substrate.

When the etch process is performed under at least one of the selected conditions mentioned above, the density of the etch plasma in the chamber increases or activity of the etch plasma decreases. Thus, sidewalls of the etch target are etched, thereby decreasing the width.

In this embodiment, since the gate hard mask layer 52 is a nitride layer, the flow rate of the etch gas, which is a gas mixture of $SF_6$, CHF, and Ar, increases to decrease the width of the gate hard mask layer 52.

For instance, the etch process of the gate hard mask layer 52 applies an etch gas of $SF_6$, $CHF_3$, and Ar flowing at a rate of approximately 20 sccm to approximately 300 sccm, a source power of approximately 80 W to approximately 1,000 W, a bias power of approximately 100 W to approximately 1,000 W, a chamber pressure of approximately of −30 mTorr to approximately 0 mTorr, and substrate temperature of approximately −100° C. to approximately −50° C. Then, the trimming process applies an etch gas of $SF_6$, $CHF_3$, and Ar flowing at a rate of approximately 45 sccm to approximately 500 sccm, a source power of approximately 200 W to approximately 2,000 W, a bias power of approximately 0 W to approximately 200 W, a chamber pressure of approximately of 1 mtorr to approximately 100 mtorr, and substrate temperature of approximately −30° C. to approximately 100° C. The trimming process may also apply an etch gas of $CHF_3$, $CF_4$, and Ar flowing at a rate of approximately 60 sccm to approximately 600 sccm. The $CHF_3$ gas protects the etched sidewalls of the nitride layer from being damaged. The $CF_4$ gas and the $SF_6$ etch the nitride layer.

Before trimming the gate hard mask layer 52, an oxidation process is additionally performed to prevent the substrate 51 from being damaged.

FIG. 6 shows electron microscopic pictures of the gate hard mask layer 52 having a decreasing width as time goes by.

Referring to FIG. 6, the width of gate hard mask layer 52 decreases as time passes from 0 second to 110 seconds.

The method for trimming the gate hard mask layer 52 can be applied to the process for decreasing the widths of the ARC layer 55, the hard mask layer 54, or the first hard mask layer 53.

For instance, the etch process of the first hard mask layer 53 including the amorphous carbon layer applies an etch gas including oxygen ($O_2$) flowing at a rate of approximately 5 sccm to approximately 50 sccm, a source power of approximately 80 W to approximately 1,000 W, a bias power of approximately 50 W to approximately 1,000 W, a chamber pressure of approximately of −30 mTorr to approximately 0 mtorr, and substrate temperature of approximately −200° C. to approximately −100° C. Then, the trimming process applies an etch gas including $O_2$ flowing at a rate of approximately 10 sccm to approximately 100 sccm, a source power of approximately 200 W to approximately 2,000 W, a bias power of approximately 0 W to approximately 500 W, a chamber pressure of approximately 1 mtorr to approximately 100 mtorr, and substrate temperature of approximately −100° C. to approximately −30° C. The etch gas including $O_2$ may be a gas mixture Of $O_2$, hydrogen bromide (HBr), and argon (Ar) or a gas mixture of $O_2$ and nitrogen ($N_2$).

The first hard mask layer 53 is removed.

Figure 5C:
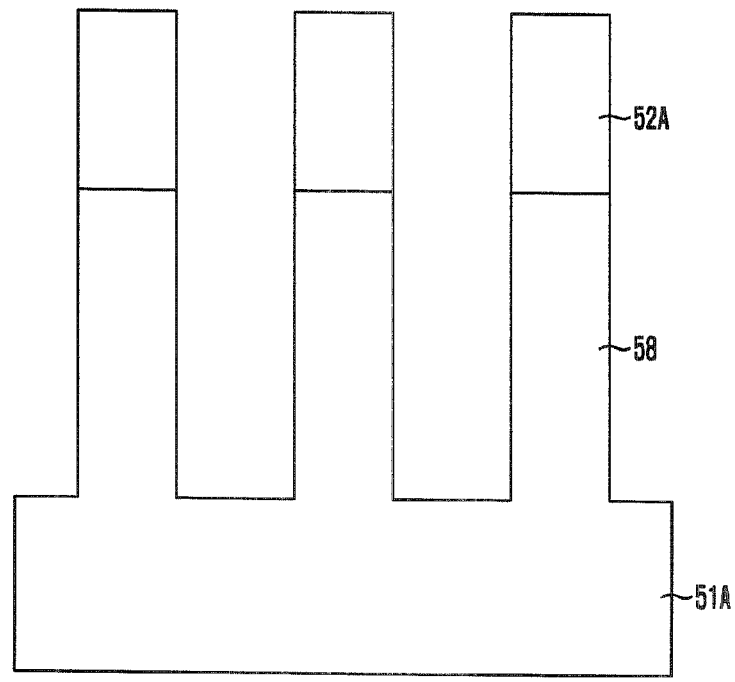

Referring to FIG. 5C, the substrate 51 is etched using the gate hard mask pattern 52A as an etch barrier. The etch process is a dry etch process, and a plurality of pillar patterns 58 are formed using the dry etch process.

Hereinafter, the etched substrate 51 is called a substrate pattern 51A.

The pillar pattern 58 is composed of Si and is formed in a square-type or a round-type, and sidewalls of the pillar pattern 58 have a vertical profile.

Since the gate hard mask pattern 52A is used as an etch barrier, the width of the pillar pattern 58 is limited to 50 nm or less, more specifically, in the range between 5 nm to 50 nm. That is, the width pillar pattern having a width over 50 nm due to a collapse of a photoresist pattern becomes to have a width of 50 nm or less through the trimming process.

Figure 5D:
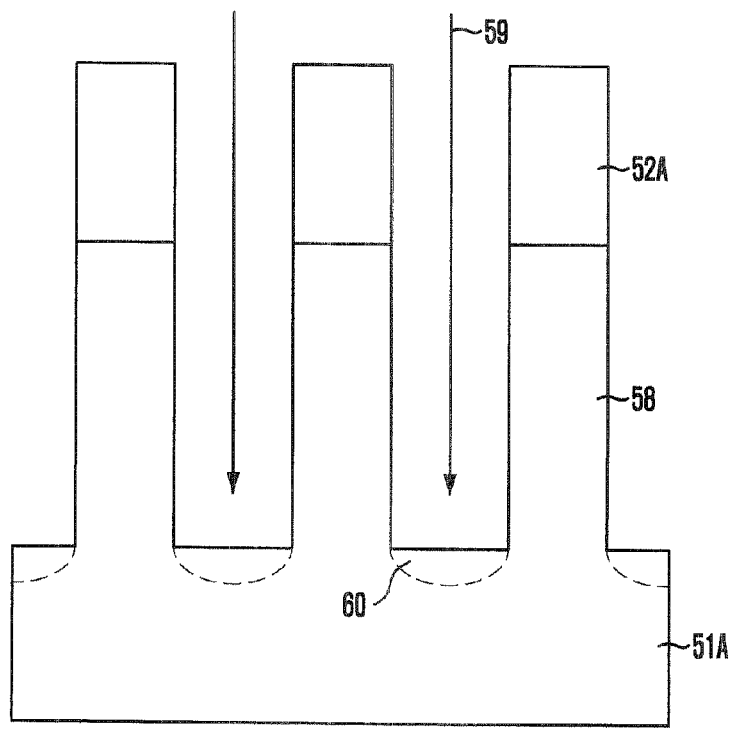

Referring to FIG. 5D, the substrate pattern 51A is doped with impurities 59. Thus, an impurity region 60 is formed in the substrate 51A between the pillar patterns 58. Also, another impurity region can be formed in upper portion of the pillar pattern 58.

The impurity regions function as a subsequent source/drain.

Figure 5E:
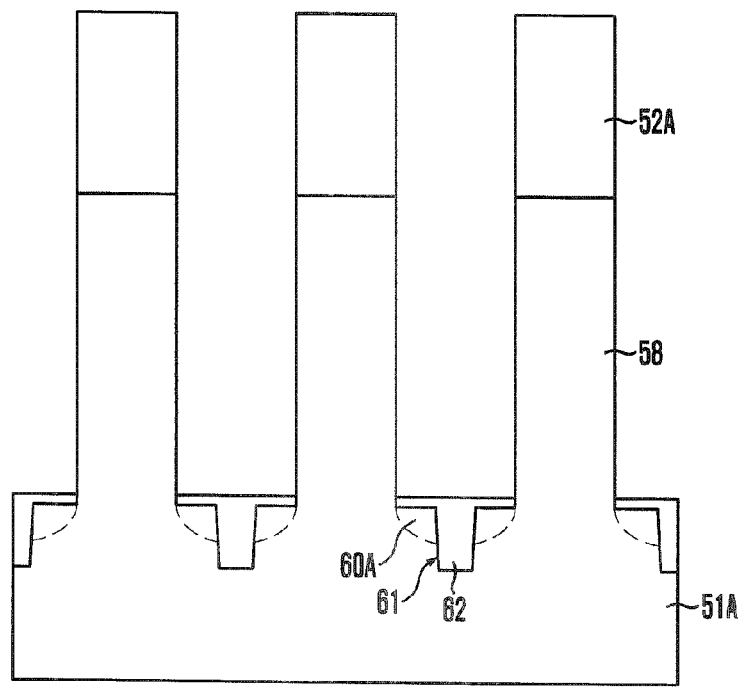

Referring to FIG. 5E, a process for dividing the impurity region 60 is performed. Thus, buried bit lines 60A are formed on both sides of the pillar pattern 58.

To divide the impurity region 60, a trench 61 is formed to divide the impurity region 60 half and half. A depth of the trench 61 should be sufficient to divide the impurity region 60. Also, the width of the trench 61 should be sufficient without causing interference.

An isolation layer 62 is formed in the trench 61 and over the substrate pattern 51A.

The isolation layer 62 including an oxide layer may be formed by deposition and etch back processes.

The etch back process is performed to expose sidewalls of the pillar pattern 58 by using a damascene wordline mask. The damascene wordline mask indicates a mask pattern having an open region for the wordline.

The etch back process may be performed by one of a dry etch back process, a dry etch back process and a combination thereof.

Figure 5F:
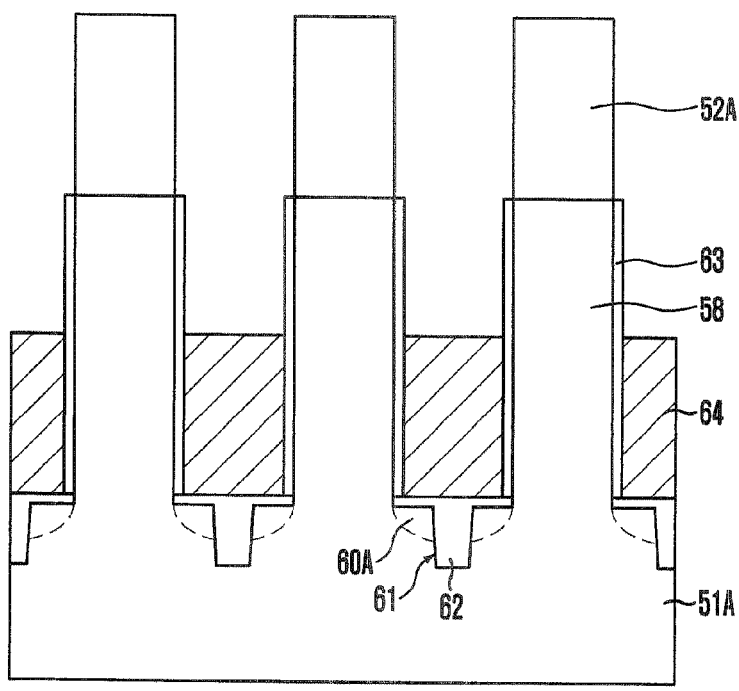

Referring to FIG. 5F, a gate insulation layer 63 is formed on sidewalls of the pillar pattern 58.

The gate insulation layer 63 is formed through a deposition process or an oxidation process.

A conductive layer 64 is formed to surround a portion of the pillar pattern 58. The conductive layer 64 is formed through a deposition process or an oxidation process.

The conductive layer 64 functions as a gate electrode to form the upper/lower channel. The conductive layer 64 also functions as a line for transmitting driving voltages to the transistors. The conductive layer 64 includes one of SiGe layer and a metal layer.

Through the above-described process, a semiconductor device with transistor array is fabricated, and the conductive layer 64, i.e., a wordline, and the bit line 60A are formed.

Figure 7:
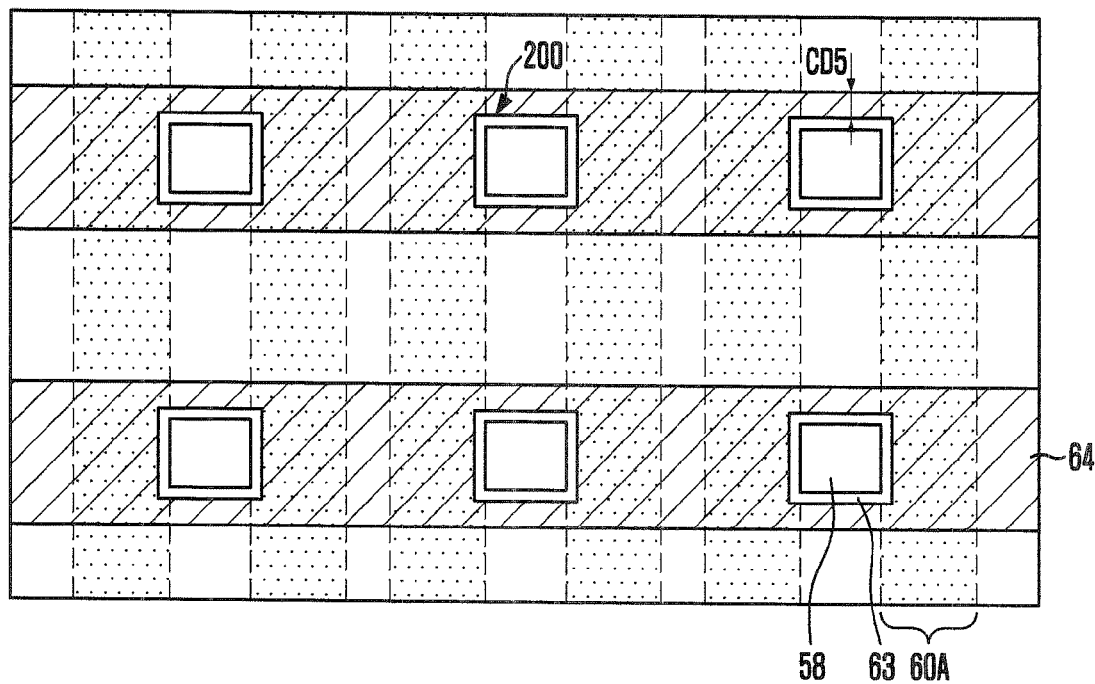
FIG. 7 is a top view of the semiconductor device shown in FIG. 5F.

FIG. 7 shows a top view of the semiconductor device of FIG. 5F.

Referring to FIG. 7, a plurality of transistors 200 are formed. The conductive layer 64 functions as a wordline and a gate electrode and the bit line 60A crossing the conductive layer 64 are formed.

The conductive layer 64 surrounds the pillar pattern 58 in the transistor 200.

Figure 1A:
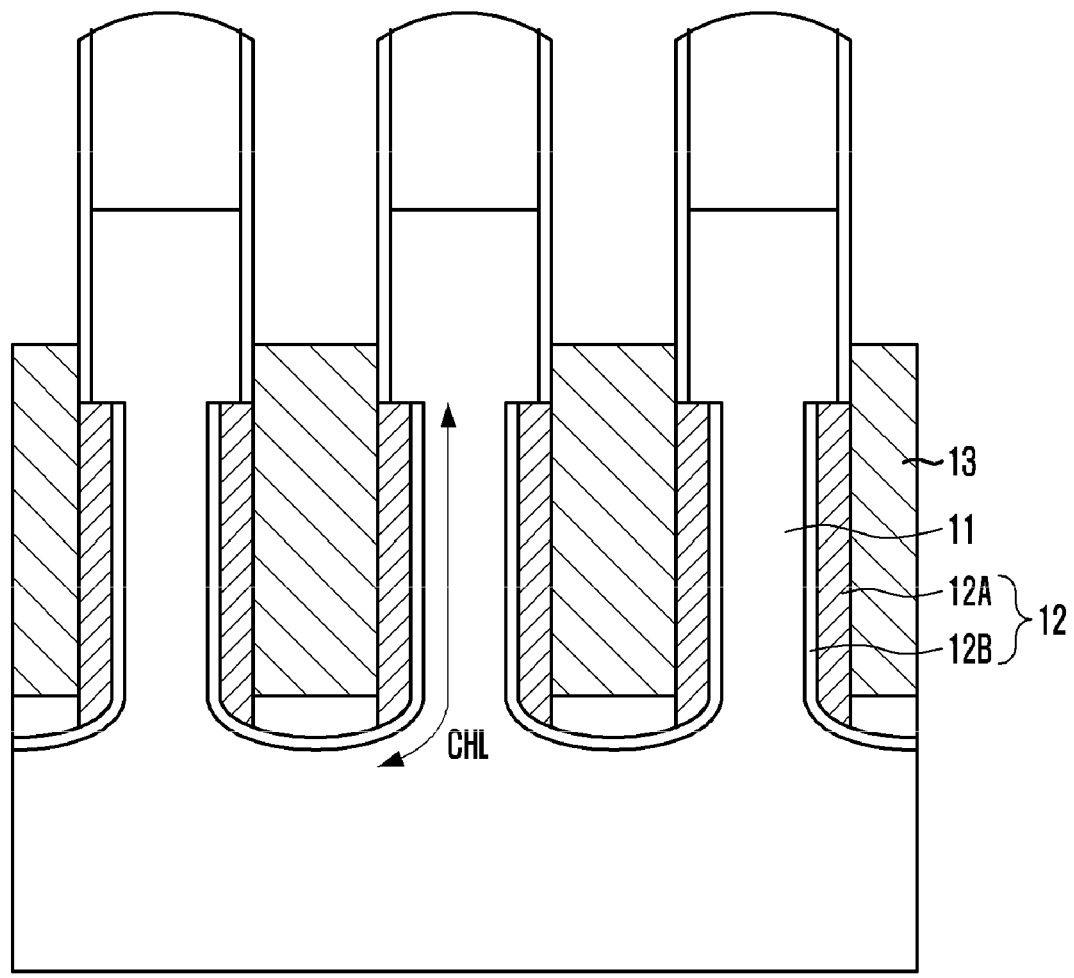
FIG. 1A is a cross-sectional view of a typical upper/lower transistor array.
Figure 1B:
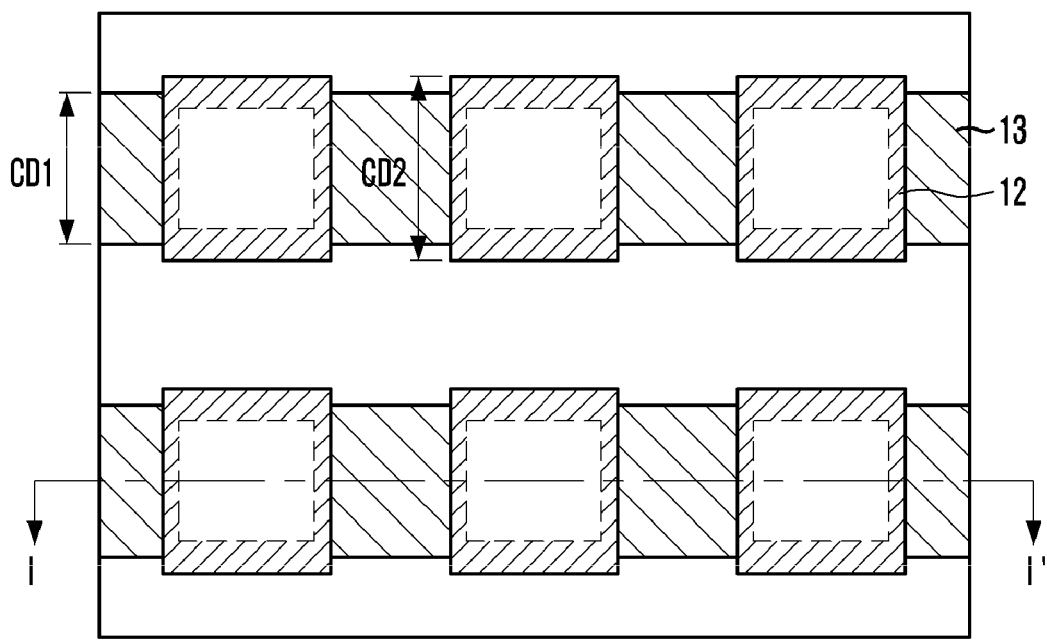
FIG. 1B is a top view of the typical upper/lower transistor array.
Figure 2:
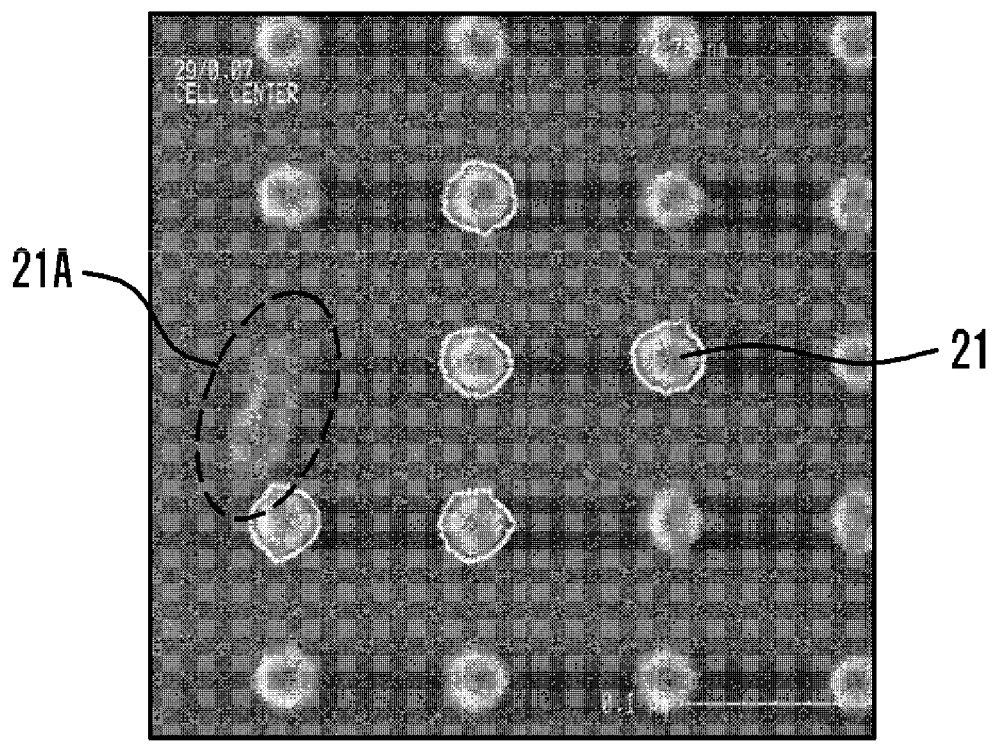
FIG. 2 is an electron microscopic picture of a collapsed photoresist pattern.

While the line pattern 13 is discontinuously formed in FIG. 1B, the conductive layer 64 is formed as a layer in FIG. 7. Also, while the wordline includes the line pattern 13 and the gate electrode 12A in FIG. 1B, the wordline further includes the conductive layer 64 in FIG. 7.

In short, the contact resistance between the line pattern 13 and the gate electrode 12A functions as an important resistance in the wordline of FIG. 1B, the wordline is not related with the contact resistance in FIG. 7.

In the first embodiment described with reference to FIG. 7, the conductive layer 64 functioning as a line and a gate electrode is formed to decrease resistance of the wordline. The conductive layer 64 is formed in a line-type. Thus, the conductive layer 64 which is not related with the contact resistance between the line and the gate electrode 12A, i.e. the wordline, is formed.

Since the linewidth of the pillar pattern 58 decreased, the resistance of the wordline formed in a line-type decreases. That is, the linewidth of the pillar pattern 58 decreases while that of the wordline is fixed, thereby forming the wordline as a line-type.

Figure 3:
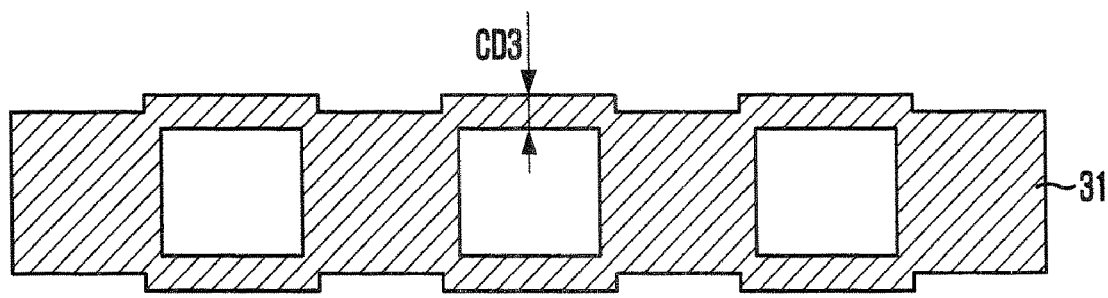
FIG. 3 is a top view of a wordline.

A fifth width CD5 of the wordline adjacent to the pillar pattern 58 increases. The fifth width CD5 is greater than the third linewidth CD3 shown in FIG. 3. In other words, dimension of the wordline increases and resistance of the wordline decreases.

The resistance of the wordline decreases and the transmission efficiency of the driving voltage of the transistor increases.

Figure 8:
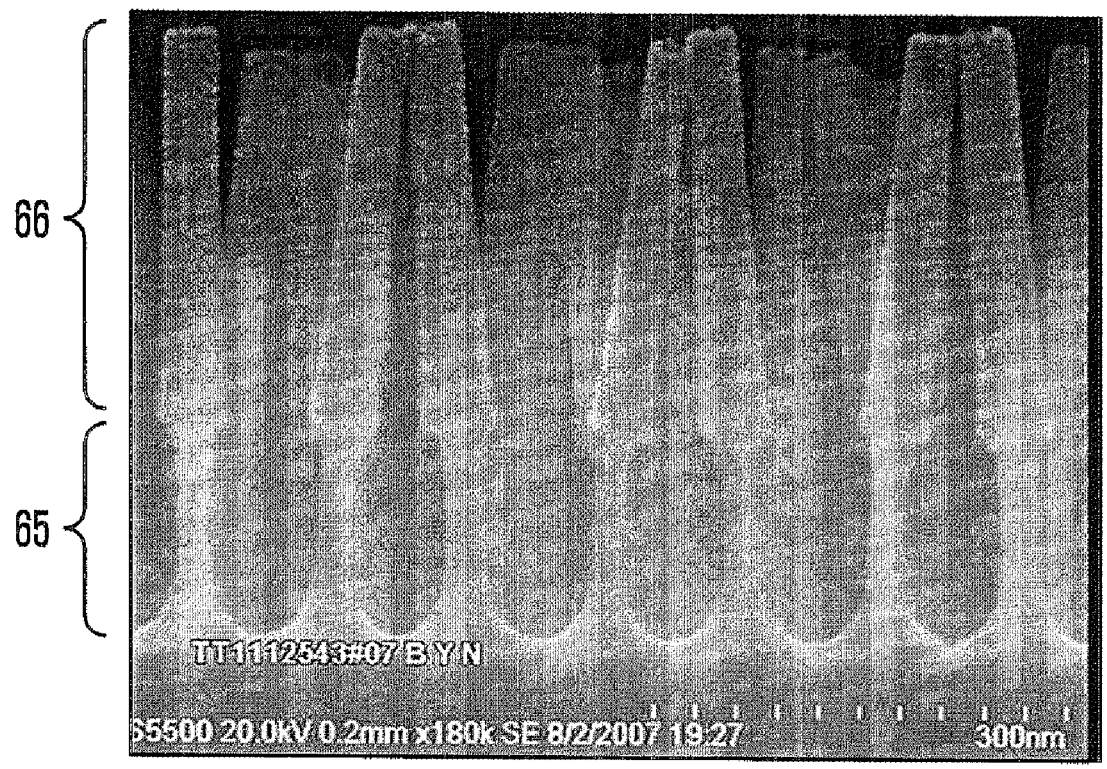
FIG. 8 is a cross-sectional view of a typical pillar pattern having a pillar neck and a pillar head.

FIG. 8 is a cross-sectional view of a typical pillar pattern including a pillar neck and a pillar head.

Referring to FIG. 8, in the typical method of forming a pillar pattern, the pillar pattern includes a pillar neck 65 and a pillar head 66. A width of the pillar neck 65 is smaller than that of the pillar head 66. That is, the pillar pattern is formed in an improper fraction.

Since the pillar neck 65 is formed by a wet etch process, it is difficult to secure a stable width. Thus, the pillar pattern collapses during the wet etch process.

In this embodiment, the pillar pattern 58 is formed by performing the trimming process, keeping a uniform width vertically. The pillar pattern 58 is formed by the dry etch process. Thus, the method in this embodiment overcomes the above-described limitation illustrated in FIG. 4.

FIG. 9A is a cross-sectional view of a semiconductor device in accordance with a second embodiment of the present invention.

Figure 9B:
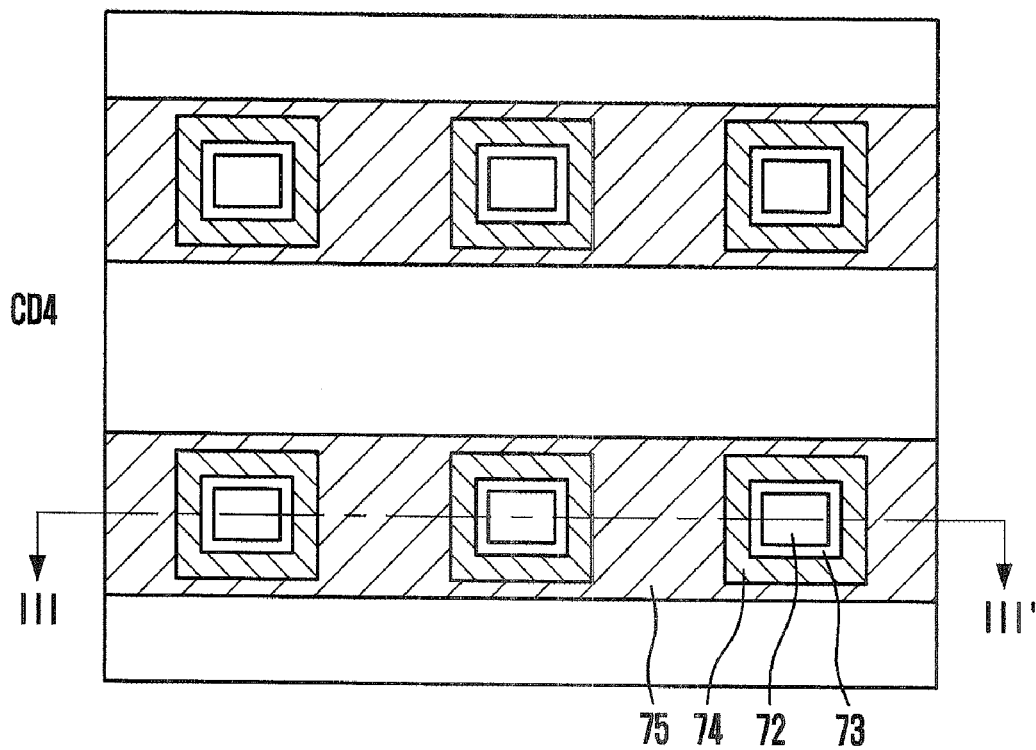
FIG. 9B is a top view of the semiconductor device in accordance with the second embodiment of the present invention.

FIG. 9B is a top view the semiconductor device in accordance with the second embodiment of the present invention.

Referring to FIGS. 9A and 9B, a semiconductor device includes a plurality of transistors 300 with an upper/lower channel. Each transistor 300 includes a pillar pattern 72, a gate insulation layer 73 formed on sidewalls of the pillar pattern 72, a gate electrode 74, which surrounds sidewalls of the gate insulation layer 73, and a line layer 75, which surrounds sidewalls of the gate electrode 74 and connects neighboring pillar patterns 72. The transistor 300 also includes a buried bit line 76 formed below the pillar pattern 72. The transistor 300 also includes source and the drain formed at the pillar pattern 72 in contact with upper and lower portions of the gate electrode 74. The transistor 300 includes a buried bit line 76 formed below the pillar pattern 72.

The pillar pattern 72 is formed by etching the substrate 71 or performing deposition and patterning processes. The pillar pattern 72 is composed of Si and is formed in a square or a round type. Sidewalls of the pillar pattern 72 have a vertical profile.

The pillar pattern 72 is formed to have the fifth width CD5 of 50 nm or less by a trim process, more specifically, from approximately 5 nm to approximately 50 nm. The trimming process will be described in detail later.

The gate electrode 74 forms an upper/lower channel due to the driving voltage transmitted through the line layer 75.

Since contact area between the gate electrode 74 for a wordline and the line layer 75 increases, the line layer 75 is formed in a line. That is, since the line layer 75 surrounds the gate electrode 74, the maximum contact area can be acquired. Thus, the contact resistance decreases.

The gate electrode 74 and the line layer 75 is comprised of one type of layers selected from the group consisting of a polysilicon layer, a silicon germanium (SiGe) layer, a tungsten (W) layer, a cobalt (Co) layer, a nickel (Ni) layer, a titanium (Ti) layer, a tungsten silicide (WSi) layer, a cobalt silicide (CoSi) layer, a nickel silicide (NiSi) layer, and a titanium silicide (TiSi) layer. The gate electrode 74 and the line layer 75 may include a conductive layer of the same kind or different kinds. To reduce resistance, the gate electrode 74 and the line layer 75 may include a conductive layer of the same kind. However, considering a threshold voltage of the transistor, the gate electrode 74 may include a conductive layer that can be easily formed and approach to the set threshold voltage. Also, when the line layer 75 includes a metal layer, the wordline has low resistance, thereby increasing the transmission efficiency of the driving voltage.

A buried bit line 76 is formed by doping impurities.

FIGS. 10A to 10H are cross-sectional views describing a method for fabricating the semiconductor device with the upper/lower transistor in accordance with a second embodiment of the present invention.

Referring to FIG. 10A, to fabricate a transistor having an upper/lower channel, a gate hard mask layer 82 and a plurality of hard mask layers are formed over a substrate 81.

The gate hard mask layer 82 includes a nitride layer, specifically a $Si_3N_4$ layer.

The hard mask layers include a first hard mask layer 83 and a second hard mask layer 84. An ARC layer 85 and a photoresist pattern 86 are formed over the second hard mask layer 84.

The first hard mask layer 83 includes an amorphous carbon layer and the second hard mask layer 84 includes a SiON layer.

The ARC layer 85, the second hard mask layer 84, the first hard mask layer 83, and the gate hard mask layer 82 are etched using the photoresist pattern 86 as an etch barrier. When the first hard mask layer 83 is etched, the photoresist pattern 86 and the ARC layer 85 are removed. When the gate hard mask layer 82 is etched, the second hard mask layer 84 is removed.

Referring to FIG. 10B, the gate hard mask layer 82 having a decreased linewidth is called a gate hard mask pattern 82A. The trimming process is performed until the width of the gate hard mask layer 82 becomes approximately 50 nm or less, more specifically from approximately 5 nm to approximately 50 nm.

The trimming process is performed to decrease a width of an etch target. The trimming process is performed by increasing at least one feature selected from the group consisting of: flow rate of an etch gas, a source power, a chamber pressure, and a substrate temperature from the conditions applied to the process for forming the gate hard mask layer 82. For instance, the flow rate of the etch gas and the source power may increase or the flow rate of the etch gas and the source power may increase. Or, the flowing of the etch gas, the source power, the chamber pressure, and the substrate temperature may simultaneously increase. The source power is applied to generate etch plasma using the etch gas. The trimming process is also performed by decreasing a bias power compared to the process for fabricating the gate hard mask layer 82. The bias power is applied to induce the etch plasma to the substrate.

When the etch process is performed by applying one of the above conditions, density of the etch plasma in the chamber increases or activity of the etch plasma decreases. Thus, sidewalls of the etch target are etched, thereby decreasing the width.

In this embodiment, since the gate hard mask layer 82 includes a nitride layer, the flowing rate of the etch gas, i.e. a gas mixture of $SF_6$, CHF, and Ar, increases to decrease the linewidth of the gate hard mask layer 82.

For instance, the etch process of the gate hard mask layer 82 applies an etch gas of $SF_6$, $CHF_3$, and Ar flowing at a rate of approximately 20 sccm to approximately 300 sccm, a source power of approximately 80 W to approximately 1,000 W, a bias power of approximately 100 W to approximately 1,000 W, a chamber pressure of approximately of −30 mtorr to approximately 0 mtorr, and a substrate temperature of approximately −200° C. to approximately −100° C. Then, the trimming process applies the etch gas of $SF_6$, $CHF_3$, and Ar flowing at a rate of approximately 45 sccm to approximately 500 sccm, the source power of approximately 20 W to approximately 200 W, the bias power of approximately 0 W to approximately 200 W, the chamber pressure of approximately of 1 mTorr to approximately 100 mTorr, and the substrate temperature of approximately −100° C. to approximately −30° C. The trimming process can apply an etch gas of $CHF_3$, $CF_4$, and Ar flowing at a rate of approximately 60 sccm to approximately 600 sccm. The $CHF_3$ prevents the etched sidewalls of the nitride layer from being damaged. The $CF_4$ and the $SF_6$ etch the nitride layer.

Before trimming the gate hard mask layer 82, an oxidation process can be additionally performed to protect the substrate 81 from being damaged.

The method for trimming the gate hard mask layer 82 can be applied to the process for decreasing the width of the ARC layer 85, the second hard mask layer 84, or the first hard mask layer 83.

For instance, the etch process of the first hard mask layer 83 including the amorphous carbon layer applies an etch gas of $O_2$ flowing at a rate of approximately 5 sccm to approximately 50 sccm, a source power of approximately 80 W to approximately 1,000 W, a bias power of approximately 50 W to approximately 1,000 W, a chamber pressure of approximately of −30 mtorr to approximately 0 mtorr, and substrate temperature of approximately −200° C. to approximately −100° C. Then, the trim process applies an etch gas of $O_2$ flowing at a rate of approximately 10 sccm to approximately 100 sccm, a source power of approximately 200 W to approximately 2,000 W, a bias power of approximately 0 W to approximately 500 W, a chamber pressure of approximately of 1 mTorr to approximately 100 mTorr, and substrate temperature of approximately −100° C. to approximately −30° C. The etch gas including $O_2$ may be a gas mixture of $O_2$, HBr, and Ar or a gas mixture of $O_2$ and $N_2$.

The first hard mask layer 83 is removed.

Figure 10C:
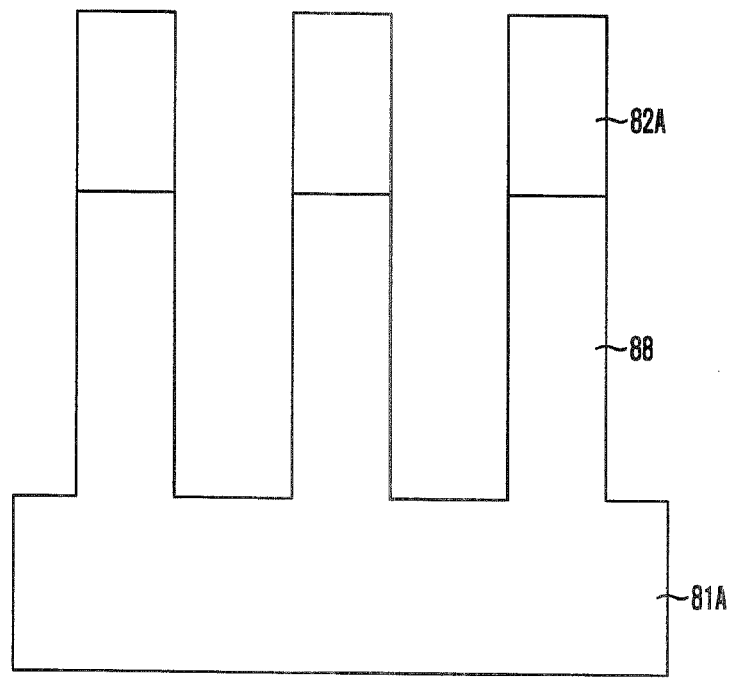

Referring to FIG. 10C, the substrate 81 is etched using the gate hard mask pattern 82A as an etch barrier. The etch process is a dry etch process. Thus, a plurality of pillar patterns 88 are formed using the dry etch process.

Hereinafter, the etched substrate 81 is called a substrate pattern 81A.

The pillar pattern 88 is composed of Si and is formed in a square-type or a round-type. Sidewalls of the pillar pattern 88 have a vertical profile.

Since the gate hard mask pattern 82A is used as an etch barrier, the pillar pattern 88 has a width of 50 nm or less. That is, the pillar pattern having a width over 50 nm due to a collapse of the photoresist pattern becomes to have a linewidth of 50 nm or less by the trimming process.

Figure 10D:
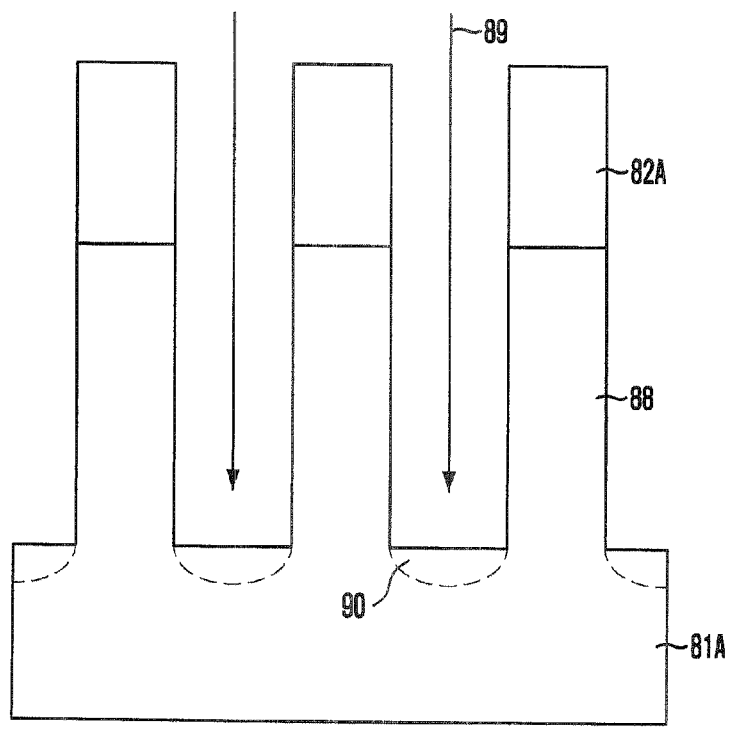

Referring to FIG. 10D, the substrate pattern 81A is doped with impurities 89 to thereby form an impurity region 90 in the substrate 81A between the pillar patterns 88. The impurity regions 90 in the upper portion of the pillar pattern 88 function as source/drain regions for forming the upper/lower channels.

Figure 10E:
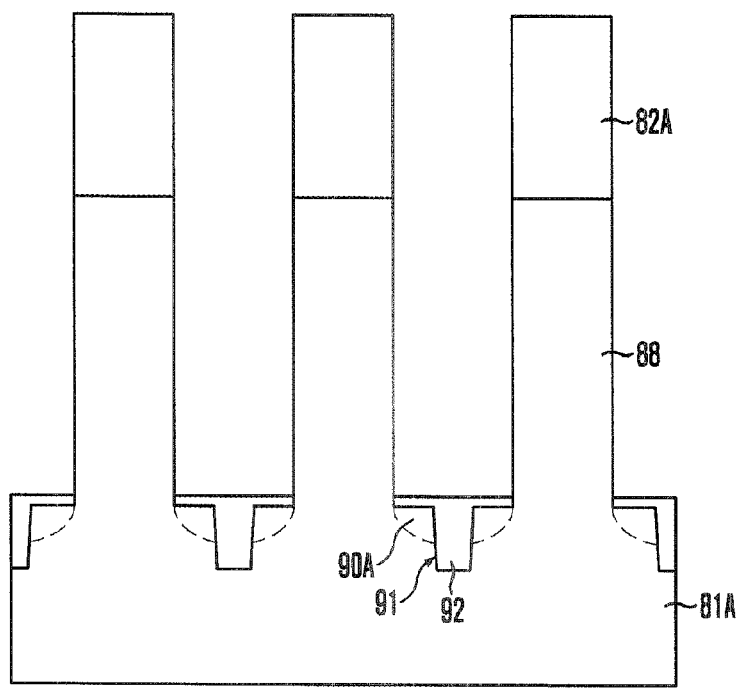

Referring to FIG. 10E, a process for dividing the impurity region 90 is performed. Thus, a buried bit line 90A is formed on both sides of the pillar pattern 88.

In the process for dividing the impurity region 90, a trench 91 is formed to divide the impurity region 90. A depth of the trench 91 should be sufficient to divide the impurity region 90. Also, the width of the trench 91 should be sufficient without causing an interference.

An isolation layer 92 is formed in the trench 91 and over substrate pattern 91A.

The isolation layer 92 including an oxide layer may be formed by deposition and etch back processes.

The etch back process is performed to expose sidewalls of the pillar pattern 58 by using a damascene wordline mask. The damascene wordline mask is a mask pattern including an open region for the wordline.

The etch back process may be one of a wet etch back process, a dry etch process, and a combination thereof.

Figure 10F:
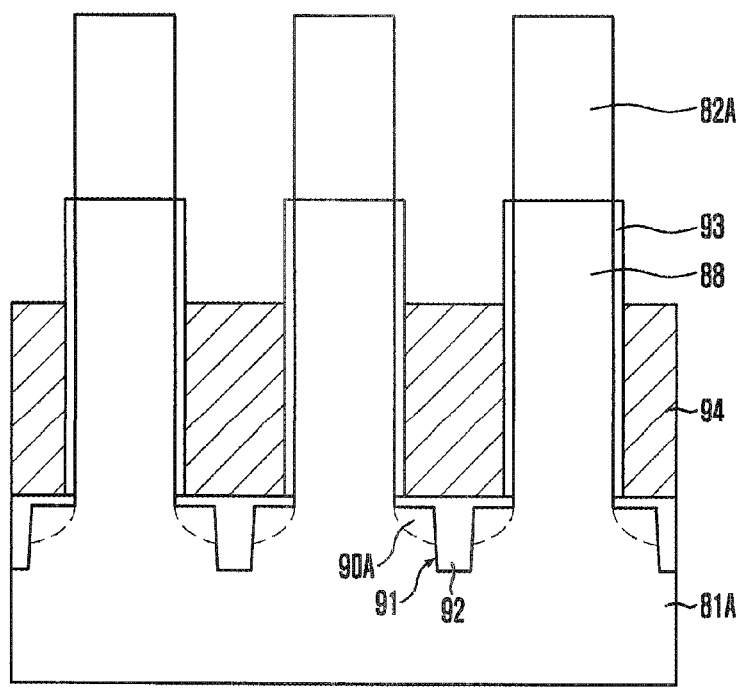

Referring to FIG. 10F, a gate insulation layer 93 is formed on sidewalls of the pillar pattern 88.

The gate insulation layer 93 is formed through a deposition process or an oxidation process.

A gate electrode 94 is formed to fill a portion of the pillar pattern 88. The gate electrode 94 may be formed through deposition and etch back processes.

The gate electrode 94 is composed of one type of layer selected from the group consisting of: a polysilicon layer, a SiGe layer, a W layer, a Co layer, a Ni layer, a Ti layer, a WSi layer, a CoSi layer, a NiSi layer, and a TiSi layer.

Figure 10G:
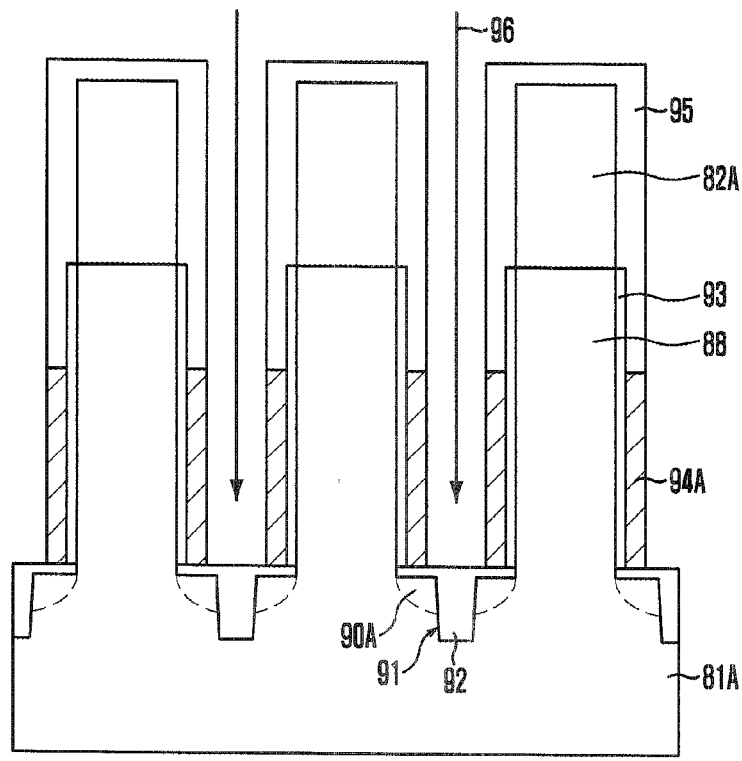

Referring to FIG. 10G, the gate electrode 94 is etched to form a gate electrode pattern 94A, which surrounds sidewalls of the pillar pattern 88. This etch process is performed by a mask pattern 95 on the gate electrode 94 adjacent to the pillar pattern 88and etching the gate electrode 94 using the mask pattern 95 as an etch barrier. When the etch process is completed, the mask pattern 95 is removed.

Figure 10H:
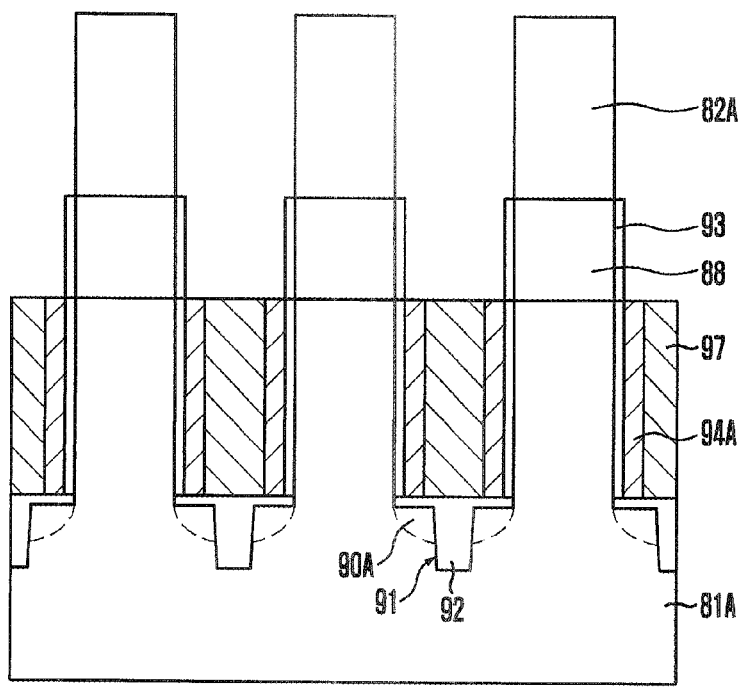

Referring to FIG. 10H, a line layer 97 is formed to surround the gate electrode pattern 94A and connect neighboring pillar patterns 88.

The line layer 97 transmits driving voltage to the transistor. The transistor is composed of any one type of layer selected form the group consisting of: a polysilicon layer, a SiGe layer, a W layer, a Co layer, a Ni layer, a Ti layer, a WSi layer, a CoSi layer, a NiSi layer, and a TiSi layer.

The gate electrode 94 and the line layer 97 may include a conductive layer of the same kind or different kinds. To reduce resistance, the gate electrode 94 and the line layer 97 may include a conductive layer of the same kind. However, considering a threshold voltage of the transistor, the gate electrode 94 may include a conductive layer that can be easily formed and approach to the set threshold voltage. Also, when the line layer 97 includes a metal layer, a wordline having low resistance is formed, thereby increasing transmission efficiency.

Thus, the semiconductor device with a transistor array is formed. The wordline including the gate electrode pattern 94A and the line layer 97, and the bit line 90A are formed.

Figure 11:
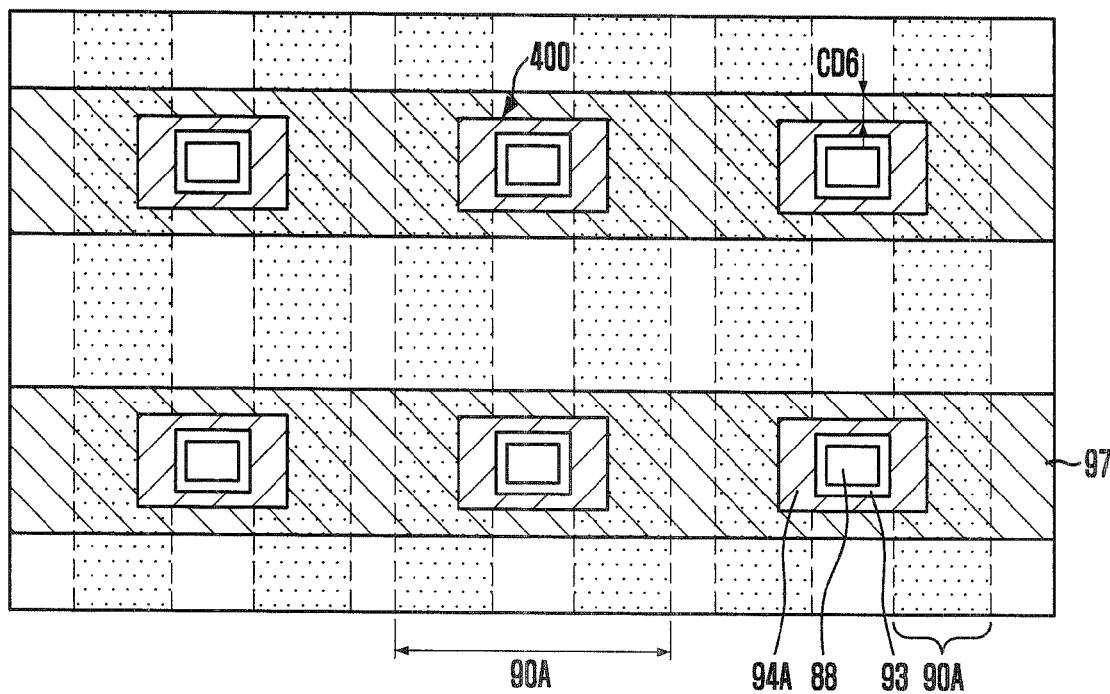
FIG. 11 is a top view of the semiconductor device shown in FIG. 10H.

FIG. 11 is a top view of the semiconductor device shown in FIG. 10H.

Referring to FIG. 11, a plurality of transistors 400 are formed. Wordline including the gate electrode pattern 94A and the line layer 97, and bit line 90A crossing the wordline are formed.

The line layer 97 surrounds the gate electrode pattern 94A.

While the line pattern 13 is not formed in a line in FIG. 1B, the line layer 97 is formed in a line in FIG. 11.

Since the line pattern 13 is connected to a portion of the gate electrode pattern 12A, contact area is insufficient. However, since the line layer 97 surrounds the gate electrode 94A, sufficient contact area can be secured.

In the second embodiment, as described referring to FIG. 11, the line layer 97 surrounds the gate electrode pattern 94A to decrease resistance of the wordline.

Thus, as the contact area increases, the resistance of the wordline decreases. The increase in the contact area indicates an increase in the contact area between the line layer 97 and the gate electrode pattern 94A.

Since the width of the pillar pattern 88 decreases, the resistance of the wordline formed in a line decreases. That is, the width of the pillar pattern 88 decreases while that of the wordline is fixed, thereby forming the wordline in a line.

A sixth width CD6 of the wordline adjacent to the pillar pattern 88 increases. The sixth width CD6 is greater than the third width CD3 in FIG. 3. In other words, the dimension of the wordline increases. As a result, the resistance of the wordline decreases to thereby increase the transmission efficiency of the driving voltage transmitted to each transistor.

In the typical method for fabricating the pillar pattern, the pillar pattern includes a pillar neck 65 and a pillar head 66. A width of the pillar neck 65 is smaller than that of the pillar head 66. That is, the pillar pattern is formed in an improper fraction-type.

Since the wet etch process is performed to form the pillar neck 65, it is difficult to secure stable width. Thus, the pillar pattern collapses during the wet etch process.

However, since the trimming process is performed to form the pillar neck 65, a uniform length of the pillar pattern can be secured. The wet etch process is performed to form the pillar pattern 88. Thus, it is possible to overcome the above limitations.

In this invention, the transmission efficiency of the driving voltage for transistors in a transistor array with an upper/lower channel increases. Furthermore, a collapse of pillar patterns is prevented.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A semiconductor device, comprising:
   pillar patterns;
   a gate insulation layer surrounding each of the pillar patterns; and
   at least a conductive layer surrounding and connecting the gate insulation layers of multiple said pillar patterns;
   wherein each of said pillar patterns has a constant width over an entire height thereof, and
   wherein said width is smaller than a develop inspection critical dimension (DICD) of photo-exposure technology and ranges from approximately 5 nm to below 50 nm wherein the gate electrode and the conductive line include different conductive materials directly contacting each other.

2. The device of claim 1, comprising multiple said conductive layers each of which is formed in a line, and surrounds and connects the gate insulation layers of the pillar patterns arranged along said line.

3. The device of claim 1, wherein the conductive layer comprises one selected from the group consisting of a polysilicon layer, a silicon germanium (SiGe) layer, a tungsten (W) layer, a cobalt (Co) layer, a nickel (Ni) layer, a titanium (Ti) layer, a tungsten silicide (WSi) layer, a cobalt silicide (CoSi) layer, a nickel silicide (NiSi) layer, and a titanium silicide (TiSi) layer.

4. The device of claim 1, wherein each of said pillar patterns forms a vertical channel.

5. The device of claim 1, further comprising
   a source formed in one of upper and lower portions of each of the pillar patterns; and
   a drain formed in the other of the upper and lower portions of said pillar pattern.

6. The device of claim 5, wherein the source or the drain formed in the lower portion of each of the pillar patterns defines a buried bit line.

7. A semiconductor device, comprising:
   pillar patterns;
   a gate insulation layer surrounding each of the pillar patterns;
   a gate electrode surrounding the gate insulation layer; and
   at least a conductive line surrounding and connecting the gate electrodes of multiple said pillar patterns;
   wherein the gate electrode and the conductive line include different conductive materials directly contacting each other.

8. The device of claim 7, comprising multiple said conductive line layers each of which is formed in a line, and surrounds and connects the gate electrodes of the pillar patterns arranged along said line.

9. The device of claim 7, wherein each of the gate electrode and the conductive line comprises one selected from the group consisting of a polysilicon layer, a SiGe layer, a W layer, a Co layer, a Ni layer, a Ti layer, a WSi layer, a Co layer, a NiSi layer, and a TiSi layer.

10. The device of claim 7, wherein
    each of said pillar patterns forms a vertical channel having a constant width over an entire height thereof, and
    wherein said width is smaller than a develop inspection critical dimension (DICD) of photo-exposure technology and ranges from approximately 5 nm to below 50 nm.

11. The device of claim 7, further comprising
    a source formed in one of upper and lower portions of each of the pillar patterns; and
    a drain formed in the other of the upper and lower portions of said pillar pattern.

12. The device of claim 11, wherein the source or the drain formed in the lower portion of each of the pillar patterns defines a buried bit line.

13. A method of fabricating a semiconductor device, the method comprising:
    forming pillar patterns over a substrate, wherein each of said pillar patterns has a constant width over an entire height thereof, and wherein said width is smaller than a develop inspection critical dimension (DICD) of photo-exposure technology and ranges from approximately 5 nm to below 50 nm;

forming a gate insulation layer to surround each of the pillar patterns; and forming at least a conductive layer to surround and connect the gate insulation layers of multiple said pillar patterns wherein the gate electrode and the conductive line include different conductive materials directly contacting each other.

14. The method of claim 13, wherein multiple said conductive layers are formed each as a line to surround and connect the gate insulation layers of the pillar patterns arranged along said line.

15. The method of claim 13, wherein the conductive layer comprises one selected from the group consisting of a polysilicon layer, a SiGe layer, a W layer, a Co layer, a Ni layer, a Ti layer, a WSi layer, a CoSi layer, a NiSi layer, and a TiSi layer.

16. The method of claim 13, wherein each of said pillar patterns is formed as a vertical channel.

17. The method of claim 13, further comprising, after forming the pillar patterns, forming a source in one of upper and lower portions of each of the pillar patterns; and forming a drain in the other of the upper and lower portions of said pillar pattern.

18. The method of claim 13, wherein the source or the drain is formed in the lower portion of each of the pillar patterns as a buried bit line.

19. The method of claim 13, wherein said forming the pillar patterns comprises:

forming a first hard mask layer and a second hard mask pattern over the substrate;

etching the first hard mask layer by using the second hard mask pattern as an etch barrier to form a first hard mask pattern;

decreasing a width of the first hard mask pattern; and etching the substrate by using the first hard mask pattern having the decreased width as an etch barrier to form said pillar patterns .

20. The method of claim 19, wherein said decreasing the width of the first hard mask pattern is performed by increasing at least one selected from the group consisting of a flow rate of an etch gas, a source power, a chamber pressure, and a substrate temperature to be higher than that with which the first hard mask pattern is formed.

21. The method of claim 19, wherein said decreasing the width of the first hard mask pattern is performed by decreasing a bias power to be lower than that with which the first hard mask pattern is formed.

22. A method of fabricating a semiconductor device, the method comprising:

providing a substrate;

forming pillar patterns;

forming a gate insulation layer to surround each of the pillar patterns;

forming a gate electrode to surround each of the gate insulation layers; and forming at least a conductive line to surround and connect the gate electrodes of multiple said pillar patterns;

wherein the gate electrode and the conductive line comprise different conductive materials directly contacting each other.

23. The method of claim 22, wherein multiple said conductive line layers are formed each as a line to surround and connect the gate electrodes of the pillar patterns arranged along said line.

24. The method of claim 22, wherein each of the gate electrode and the conductive line comprises one selected from the group consisting of a polysilicon layer, a SiGe layer, a W layer, a Co layer, a Ni layer, a Ti layer, a WSi layer, a CoSi layer, a NiSi layer, and a TiSi layer.

25. The method of claim 22, wherein each of said pillar patterns is formed as a vertical channel having a constant width over an entire height thereof, and wherein said width is smaller than a develop inspection critical dimension (DICD) of photo-exposure technology and ranges from approximately 5 nm to below 50 nm.

26. The method of claim 22, further comprising, after forming the pillar patterns, forming a source in one of upper and lower portions of each of the pillar patterns; and forming a drain in the other of the upper and lower portions of said pillar pattern.

27. The method of claim 26, wherein the source or the drain is formed in the lower portion of each of the pillar patterns as a buried bit line.

28. The method of claim 22, wherein said forming the pillar patterns comprises:

forming a first hard mask layer and a second hard mask pattern over the substrate;

etching the first hard mask layer by using the second hard mask pattern as an etch barrier to form a first hard mask pattern;

decreasing a width of the first hard mask pattern; and etching the substrate by using the first hard mask pattern having the decreased width as an etch barrier to form said pillar patterns .

29. The method of claim 28, wherein said decreasing the width of the first hard mask pattern is performed by increasing at least one selected from the group consisting of a flow rate of an etch gas, a source power, a chamber pressure, and a substrate temperature to be higher than that with which the first hard mask pattern is formed.

30. The method of claim 28, wherein said decreasing the width of the first hard mask pattern is performed by decreasing a bias power to be lower than that with which the first hard mask pattern is formed.

31. The method of claim 22, wherein each of said pillar patterns has a constant width over an entire height thereof;

said gate insulation layer is formed to surround the respective pillar pattern over the entire height of the pillar pattern; and said gate electrode is formed to surround the respective gate insulation layer over a height less than the entire height of the respective pillar pattern.

32. The device of claim 7, wherein:

when seen in plan view in a direction normal to the substrate, the gate electrode has a greater thickness in a length direction of the conductive line than in a width direction of the conductive line.

* * * * *